(12) United States Patent
Chakravorty

(10) Patent No.: US 6,452,776 B1
(45) Date of Patent: Sep. 17, 2002

(54) CAPACITOR WITH DEFECT ISOLATION AND BYPASS

(75) Inventor: Kishore K. Chakravorty, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/543,810

(22) Filed: Apr. 6, 2000

(51) Int. Cl.[7] .............................................. H01G 4/005
(52) U.S. Cl. ...................... 361/303; 361/324; 361/311; 361/305; 361/306; 257/520; 438/241
(58) Field of Search ................................ 361/303, 395, 361/15, 286, 306, 305, 309, 311, 324, 230, 235; 438/241; 257/530

(56) References Cited

U.S. PATENT DOCUMENTS

| | | | | |
|---|---|---|---|---|
| 3,826,949 A | * | 7/1974 | Nakamura et al. | 315/169 |
| 4,436,953 A | * | 3/1984 | Gottlieb | 174/72 |
| 4,453,199 A | * | 6/1984 | Ritchie et al. | 361/306 |
| 5,075,816 A | * | 12/1991 | Stormbom | 361/286 |
| 5,625,220 A | * | 4/1997 | Liu et al. | 257/530 |
| 5,770,885 A | * | 6/1998 | McCollum et al. | 257/530 |
| 5,879,982 A | * | 3/1999 | Park et al. | 438/281 |
| 5,986,875 A | * | 11/1999 | Donde et al. | 361/324 |
| 6,023,405 A | * | 2/2000 | Shamouilian et al. | 361/324 |
| 6,055,150 A | * | 4/2000 | Clinton et al. | 361/324 |
| 6,163,043 A | * | 12/2000 | Hirano et al. | 257/296 |

* cited by examiner

Primary Examiner—Dean A. Reichard
Assistant Examiner—Nguyen Ha
(74) Attorney, Agent, or Firm—Schwegman, Lundberg, Woessner & Kluth, P.A.

(57) ABSTRACT

Capacitors having defect isolation and bypass characteristics. The capacitors include a first electrode, a second electrode containing electrode segments, and a dielectric layer interposed between the first electrode and second electrode. The electrode segments of the second electrode are physically separated from other electrode segments. The capacitors further include an interconnection bus electrically coupling the electrode segments of the second electrode. Selective isolation of one or more electrode segments permits isolation and bypass of any defects identified in those electrode segments.

11 Claims, 5 Drawing Sheets

CAPACITOR WITH DEFECT ISOLATION AND BYPASS

TECHNICAL FIELD OF THE INVENTION

The invention relates generally to capacitors, and more particularly to capacitors having defect isolation and bypass capabilities, apparatus utilizing such capacitors, and methods of their fabrication.

BACKGROUND OF THE INVENTION

Electronic circuits, and particularly computer and instrumentation circuits, have in recent years become increasingly powerful and fast. As circuit frequencies exceed several hundred megahertz (MHz), with the associated spectral components exceeding 10 gigahertz (GHz), noise in the DC power and ground lines increasingly becomes a problem. This noise can arise due to inductive and capacitive parasitics, for example, as is well known. To reduce such noise, capacitors known as decoupling capacitors are often used to provide a stable supply of power to the circuitry. The decoupling capacitors are generally placed as close to the load as practical to increase their effectiveness.

Capacitors are further utilized to dampen power overshoot when an electronic device is powered up, and to dampen power droop when the electronic device begins using power, such as the immediate need for voltage caused by a processor performing a calculation.

Often, the capacitors are surface mounted to the electronic device, such as a processor, or the package substrate on which it is mounted. Other solutions have involved the formation of a planar capacitor integrated on or embedded within a substrate, such as high-density interconnect (HDI) substrates and ceramic multilayer structures. As electronic devices continue to advance, there is an increasing need for higher levels of capacitance for decoupling and power dampening at reduced inductance levels.

Higher capacitance requirements can require increasing surface area of the capacitor. This increases the risk of shorts or leakage, thus reducing device yield and increasing device reliability concerns.

As will be seen from the above concerns, there exists a need for alternative capacitance solutions in the fabrication and operation of electronic and integrated circuit devices.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is, therefore, not to be taken in a limiting sense, and the scope of the invention is defined only by the appended claims and equivalents thereof. Like numbers in the figures refer to like components, which should be apparent from the context of use.

The various embodiments will be described in the context of embedded capacitors for microprocessor package applications. One example of a microprocessor package is that of an integrated circuit semiconductor die mounted to a printed circuit board (PCB), the PCB providing physical support and ancillary circuitry and components facilitating use of the processor contained on the die. However, the invention is not so limited. Those skilled in the art will recognize that the various embodiments of the invention are adapted for use in conjunction with other electronic devices as well as other multi-layer electronic substrates, such as motherboards and other printed circuit boards, high-density interconnect (HDI) substrates and ceramic multilayer structures.

Figure 1A:
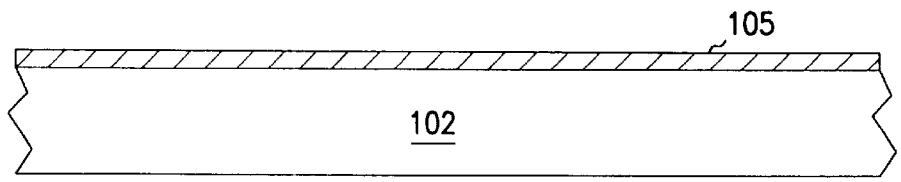
FIGS. 1A–1E are cross-sectional views of an electronic device at various processing stages of forming a capacitor and interconnection bus.
Figure 1B:
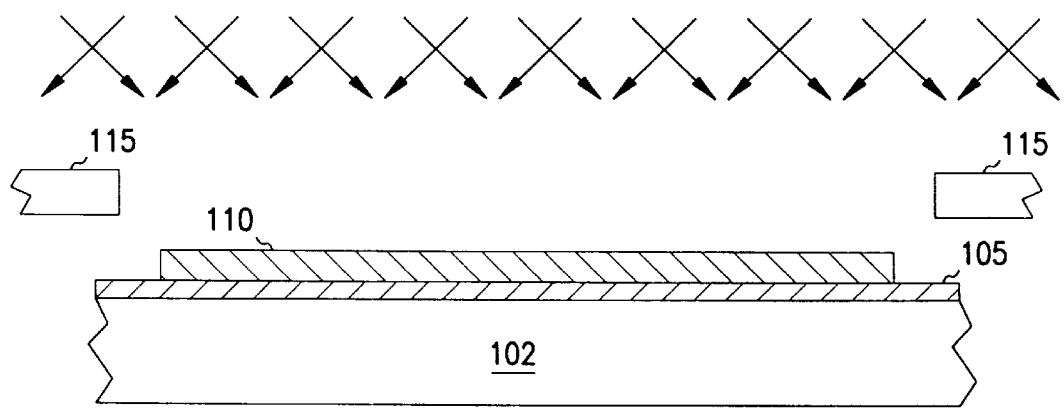

FIGS 1A–1B depict a portion of an electronic device. The electronic device of FIGS. 1A–1E is shown at various processing stages in the formation of a capacitor in accordance with one embodiment of the invention.

FIG. 1A depicts a substrate 102. For one embodiment, the substrate 102 is a printed circuit board (PCB) or other organic substrate for use in supporting electronic circuitry. The substrate 102 is generally of an insulative material and may include other structures such as ceramic substrates and the like. The substrate 102 is often multi-layered, containing conductive runs between adjacent layers. The surface of the substrate 102 should generally be planar and smooth to reduce the probability of shorts or other defects in the subsequently formed capacitor. Planarizing the surface of the substrate may generally be effected by grinding or polishing as is well known in the art.

A first electrode 105 of conductive material is formed overlying the substrate 102. The first electrode 105 may be a plated metal or laminated metal foil, e.g., plated copper (Cu) or laminated copper foil. Copper is a common plating material used in printed circuit board manufacture. The first electrode 105 is formed, in one embodiment, by depositing a seed layer, such as sputter-deposited copper, on the substrate 102 and electroplating a layer of copper on the seed layer.

For another embodiment, the first electrode 105 is formed using standard photolithographic techniques. Such techniques include patterning a photolithographic mask on a surface of the substrate 102, leaving exposed those portions of the substrate 102 where it is desired to form the first electrode 105. A layer of conductive material is then deposited on the exposed portions by physical or chemical vapor deposition techniques (PVD or CVD), followed by removal the mask and any overlying deposited material. Other methods of depositing the first electrode will be apparent to those skilled in the art, such as printing of conductive inks.

In FIG. 1B, a dielectric layer 110 is formed containing a dielectric material. For one embodiment, the dielectric layer 110 contains a metal oxide, such as tantalum oxide ($Ta_2O_5$). The metal oxide of one embodiment may be formed by sputter depositing from a metal target to form a layer of the metal, and anodizing the layer of the metal, such as in a weak acid electrolyte, to form the metal oxide. For one embodiment, the weak acid electrolyte is an organic acid, e.g., citric acid, dilute non-aqueous solution of less than about 5% by weight. Such weak acid electrolytes are expected to result in a film with lower inclusions and, thus, lower stress. The thickness of the oxide can be controlled through the application of a controlled voltage. For example, using a tantalum layer for the formation of the metal oxide, an applied voltage of approximately 60V would result in a thickness of tantalum oxide of approximately 900 angstroms. Remaining non-oxidized metal in the dielectric layer 110 is not a concern as it will reside at the interface between the first electrode 105 and the dielectric layer 110 and thus not adversely affect the resulting capacitance.

Through the use of a shadow mask 115, the layer of tantalum may be sputter deposited in areas not covered by the shadow mask 115. A shadow mask 115 is a mechanical mask placed on the substrate 102, or in close proximity to the substrate 102, to block or mask areas where deposition is not desired.

Alternatively, a metal layer may be deposited by electroplating or photolithographic techniques, and converted to the metal oxide by anodization in a weak acid electrolyte or other oxidation technique. In addition, the dielectric layer 110 may be formed by RF sputtering from a composite target of a dielectric material, or through reactive sputtering from multiple elemental targets, without the need for anodization or other oxidation techniques. Metal organic CVD (MOCVD) and sol-gel techniques have further been utilized to directly form metal oxide dielectrics. Other techniques of forming layers of dielectric material are known in the art and can include CVD and plasma-enhanced CVD (PECVD). Furthermore, other dielectric materials can be utilized with the various embodiments. Examples of dielectric materials include strontium titanate ($SrTiO_3$), barium strontium titanate ($BaSrTiO_3$; BST), lead zirconium titanate ($PbZrTiO_3$; PZT), aluminum oxide ($Al_2O_3$) or zirconium oxide ($Zr_2O_3$), as well as more conventional dielectric materials such as silicon dioxide ($SiO_2$), silicon nitride (SiN) and silicon oxynitride ($SiO_xN_y$).

The designer must consider the operating conditions, especially that of temperature, when choosing a deposition technique. Organic substrates typically require processing temperatures below about 250° C. while some of the foregoing deposition techniques may require operating temperatures in excess of about 550° C. Furthermore, adhesion of the dielectric material to the first electrode 105 may be enhanced through conditioning of the first electrode 105, such as black oxide treatment of a copper electrode.

The dielectric layer 110 is formed to overlie at least a portion of the first electrode 105. For further embodiments, the dielectric layer 110 may completely cover the first electrode 105 and may further extend beyond the boundaries of the first electrode 105.

Figure 1C:
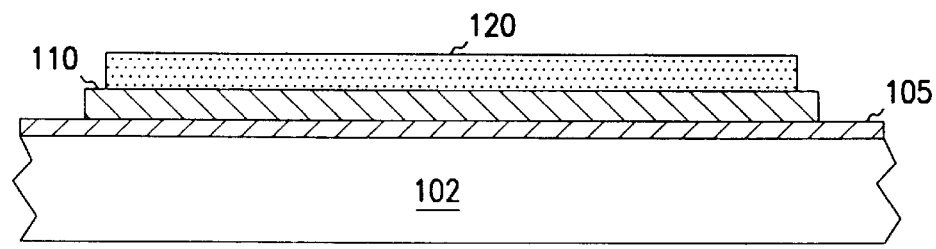

In FIG. 1C, a second electrode 120 is formed overlying the dielectric layer 110. The second electrode 120 may generally be formed by such deposition techniques as described with reference to the first electrode 105. The second electrode 120 is formed, for one embodiment, by electroless plating of a metal seed layer followed by electrolytic plating of metal. For another embodiment, a seed layer of copper or other metal may be sputter deposited on the dielectric layer 110 followed by electrolytic plating of copper or other metal on the seed layer.

Figure 1D:
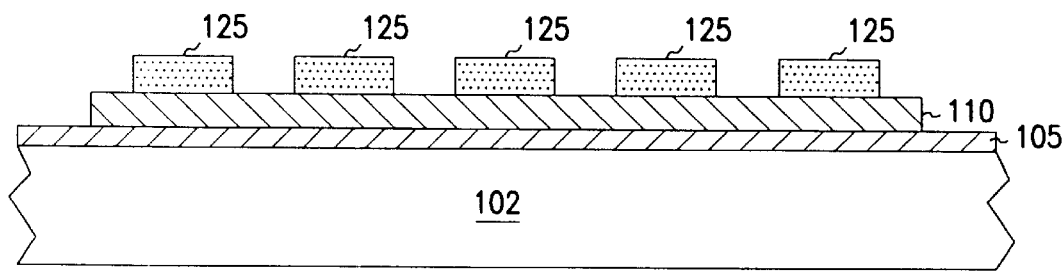

In FIG. 1D, the second electrode 120 is patterned or segmented into two or more electrode segments 125. Each electrode segment 125 is physically separated from other electrode segments 125. Each electrode segment 125 represents a portion of the second electrode 120, and thus a portion of the capacitor. At this processing stage, each electrode segment 125 is further electrically isolated from other electrode segments 125.

Separation of the second electrode 120 into the electrode segments 125 for one embodiment is carried out as part of the metal layer definition of printed circuit board fabrication by substrative etch. In this embodiment, a patterned mask is applied to the second electrode 120, covering those portions representing the future electrode segments 125. Applying a patterned mask may include forming a continuous mask on the second electrode 120 and removing portions of the mask. Subsequently, the exposed portions of the second electrode 120 are removed by an etchant and the patterned mask is removed. For another embodiment, the electrode segments 125 of the second electrode 120 are formed directly by selective deposition. Examples of selective deposition include PVD of a conductive material patterned by a shadow mask or printing of conductive inks.

Figure 1E:
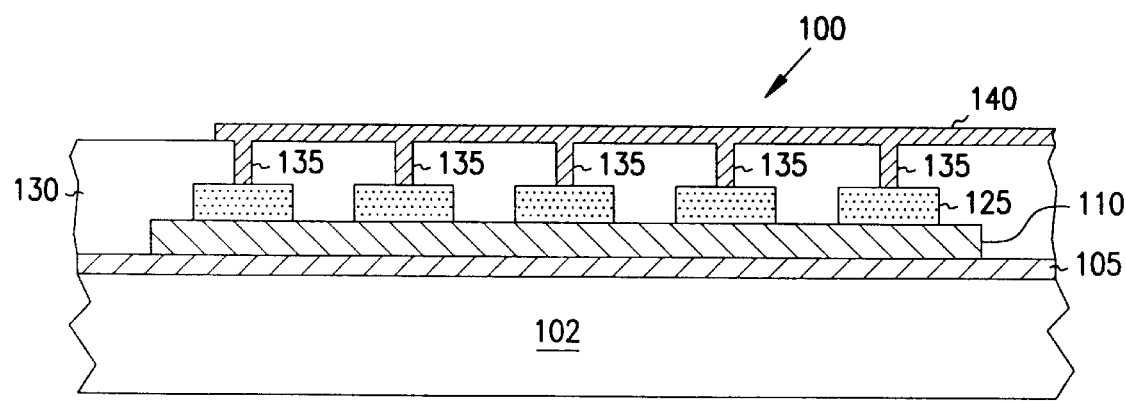

In FIG. 1E, an insulating layer 130 is formed overlying the dielectric layer 110 and the electrode segments 125 of the second electrode 120. Insulating layer 130 is any insulative material such as insulative resins or polymeric materials. Conductive vias 135 are formed to each electrode segment 125 and an interconnection bus 140 is formed to be coupled to the conductive vias 135, thereby electrically coupling the electrode segments 125. The interconnection bus 140 is any conductive material and formation can include the materials and deposition techniques described with reference to the first electrode 105 or the second electrode 120.

Figure 2A:
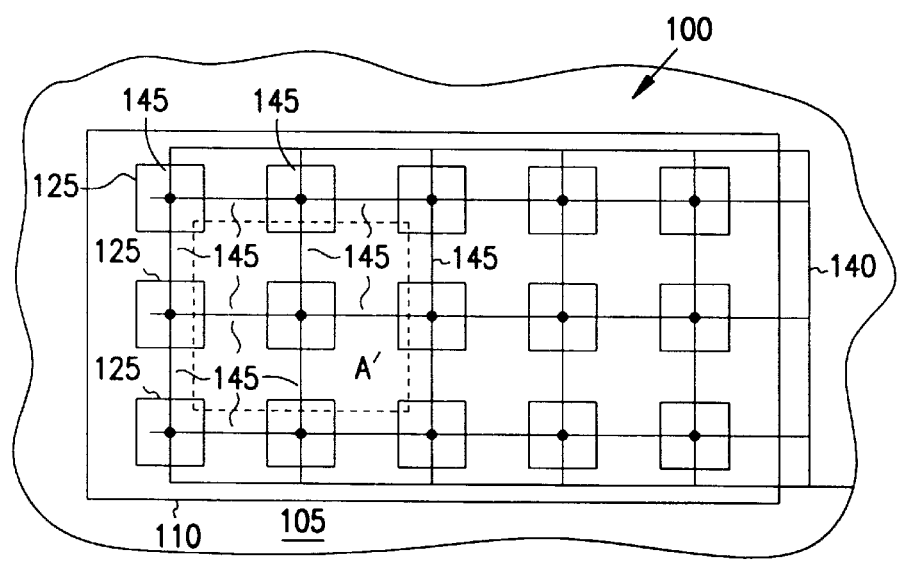
FIGS. 2A–2B are top views of the electronic device of FIGS. 1E.

FIG. 2A is a top view of the structure of FIG. 1E. The interconnection bus 140 includes fusible links 145 coupled to each electrode segment 125 through the conductive vias 135. The interconnection bus 140 of FIG. 1E forms a regular grid pattern, the repeating rows and columns forming the fusible links 145. The fusible links 145 are any conductive element adapted to selectively present an open circuit to its associated electrode segment 125, i.e., to open the conductive path from the interconnection bus 140 to an electrode segment 125. The fusible links 145 have a first state for maintaining the coupling between an electrode segment 125 and the interconnection bus 140 (and thus other electrode segments 125) and a second state for electrically isolating an electrode segment 125 from the interconnection bus 140 (and thus other electrode segments 125). Each electrode segment 125 is thus selectively electrically coupled to other electrode segments 125. As one example, fusible links 145 formed of metal lines can selectively present an open circuit through laser ablation of the fusible link 145. For another embodiment, selective etching of the fusible links 145 can be used to open the path between the interconnection bus 140 and an electrode segment 125. Taken to its extreme, the interconnection bus 140 may be a continuous layer of conductive material. For this embodiment, the interconnection bus 140 is a continuous fusible link that can present an open circuit to an electrode segment 125 by removing a ring of material surrounding the conductive via 135 coupled to the electrode segment 125.

Figure 2B:
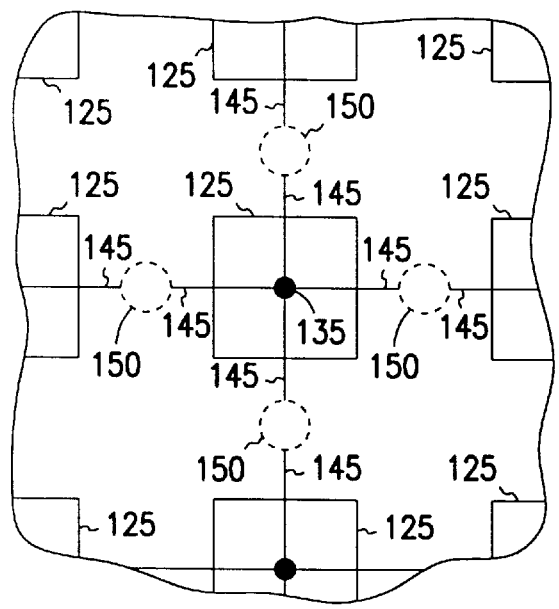

FIG. 2B is an exploded top view of the area generally defined by A' of FIG. 2A showing the electrical isolation of an electrode segment 125' from other electrode segments 125. As shown in FIG. 2B, the fusible links 145 associated with the electrode segment 125' have been opened by removing sections 150 to present an open path to the electrode segment 125'. With reference back to FIG. 2A, it can be seen that electrical isolation of the electrode segment 125' can be effected without decoupling remaining electrode segments 125. This is possible due to the parallel connectivity among the various electrode segments 125. It can also be seen that with the interconnection bus 140 of FIG. 2A, four fusible links 145 must be opened to isolate a single electrode segment 125, six to isolate two adjacent electrode segments 125, eight to isolate three adjacent electrode segments 125, etc. It may thus not be necessary to open each fusible link 145 coupled to an electrode segment 125 in order to isolate that electrode segment 125 from the interconnection bus 140, depending upon the connectivity of the interconnection bus 140 and the status of the neighboring electrode segments 125.

The resulting capacitor 100 of FIGS. 1E/2A includes the first electrode 105, the dielectric layer 110, the second electrode 120 containing electrode segments 125, and the interconnection bus 140 coupling the electrode segments 125. Conductive vias 135 may be eliminated by directly coupling the fusible links 145 of the interconnection bus 140 to the electrode segments 125. Selective isolation of one or more electrode segments 125 permits isolation and bypass of any defects identified in those electrode segments 125. Accordingly, a defect identified in one portion of the capacitor can be isolated and bypassed, thus restoring functionality to the capacitor. It should be apparent that such defect isolation will result in a capacitance value lower than the available capacitance value based on available surface area, but such reduction may be justified to make usable an otherwise defective component.

While parallel connectivity is considered more effective, serial connection is permissible. However, location of a defect can drastically affect resulting capacitance following isolation. Using an example of three electrode segments in a linear pattern with a defect located in the middle electrode segment, isolation of the defect in a series connection will result in a capacitance of approximately ⅓ of design while isolation of the defect in a parallel connection will result in a capacitance of approximately ⅔ of design.

Figure 3:
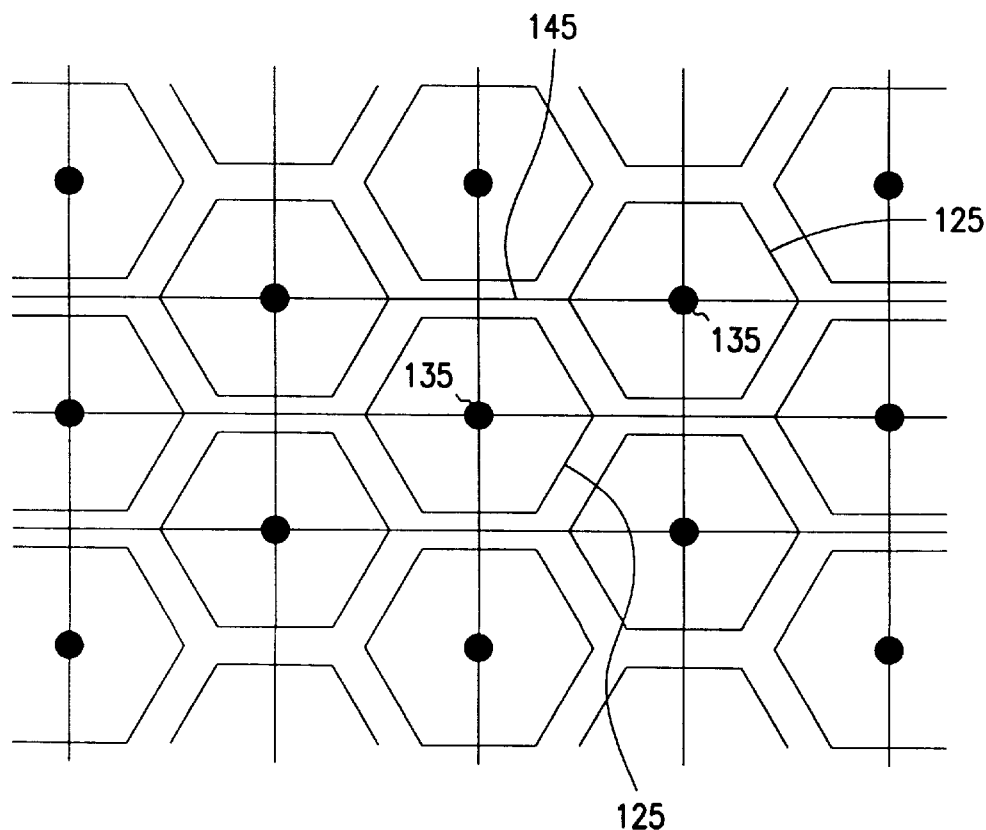
FIG. 3 is a top view of a layout pattern of electrode segments and interconnection bus.

Furthermore, while the electrode segments 125 were depicted as generally rectangular and laid out in a regular grid pattern, other geometries and layout patterns are acceptable. One example might be hexagonal electrode segments 125' laid out in a cubic closest packing pattern. An example of such a structure is shown in FIG. 3.

Figure 4A:
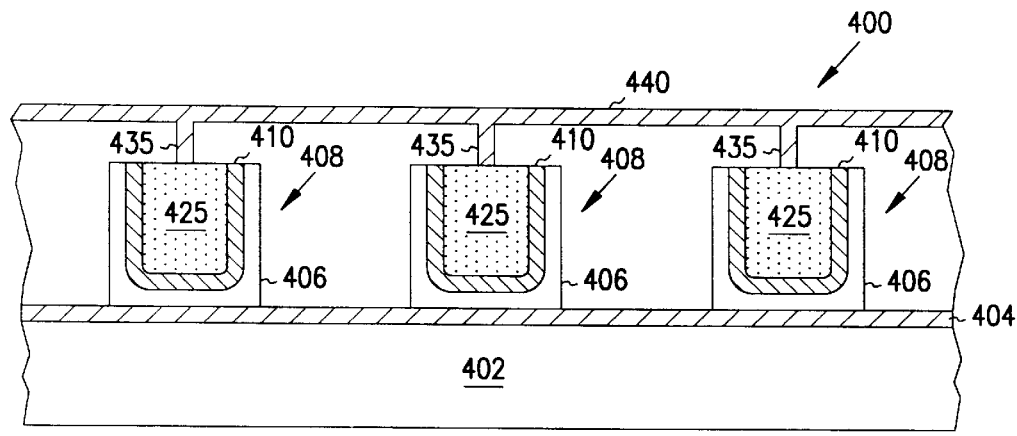
FIG. 4A is a cross-sectional view of an electronic device showing a capacitor with two interconnection buses.
Figure 4B:
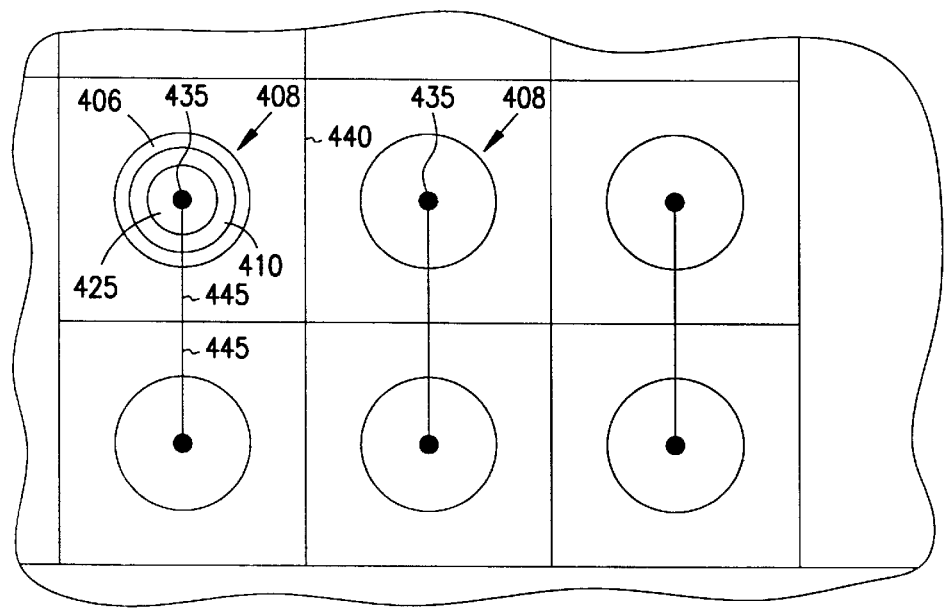
FIG. 4B is a top view of the electronic device of FIG. 4A.

The capacitor of FIGS. 1A–1E contained a contiguous first electrode. However, there is no requirement that the first electrode be contiguous. FIGS. 4A–4B depict a portion of a capacitor 400 having a segmented first electrode. The capacitive elements of FIGS. 4A–4B are shown as cylindrical container-shaped capacitive elements laid out in a regular grid pattern. The capacitive elements of FIGS. 4A–4B could be formed in blind vias of the substrate as one example. As further examples, the capacitive elements could be planar or some other geometry, and may utilize some other layout pattern. The various processing stages leading up to the capacitor 400 are generally the same as those presented in the discussion of FIGS 1A–1E, or are otherwise well known in the art.

FIG. 4A depicts a capacitor 400 according to one embodiment of the invention. The capacitor 400 includes a first interconnection bus 404 overlying a substrate 402 and two or more first electrode segments 406 coupled to the first interconnection bus 404. The combined first electrode segments 406 constitute the first electrode of the capacitor 400. The first interconnection bus 404 may electrically couple the first electrode segments 406 in parallel or series connection.

The first interconnection bus 404 may couple to the first electrode segments 406 using additional conductive vias (not shown) or other conductive paths.

A dielectric layer 410 is formed to overlie each first electrode segment 406. The dielectric layer 410 may be formed to overlie only the first electrode segments 406 as shown in FIG. 4A. Alternatively, the dielectric layer 410 may be blanket deposited over the substrate 402 to overlie each first electrode segment 406 as well as the first interconnection bus 404. In a case where dielectric layer 410 is blanket deposited, it may be necessary to etch the blanket layer to provide electrical connectivity to the underlying first interconnection bus 404. A plurality of second electrode segments 425 is formed to overlie the dielectric layer 410 of each capacitive element 408. The combined second electrode segments 425 constitute the second electrode of the capacitor 400. The second electrode segments 425 are coupled to a second interconnection bus 440. In one embodiment, the second electrode segments 425 are coupled to the second interconnection bus 440 through conductive vias 435 as shown in FIG. 4A.

FIG. 4B is a top view of the structure of FIG. 4A. As shown in FIG. 4B, the second interconnection bus 440 includes fusible links 445 coupled to each second electrode segment 425 through the conductive vias 435. FIG. 4B further demonstrates that the second interconnection bus 440 may be formed to have only one fusible link 445 coupling the second electrode segments 425 to the second interconnection bus 440. Opening the fusible link 445 associated with a second electrode segment 425 will electrically isolate that second electrode segment 425 from the interconnection bus 440, and thus other second electrode segments 425. A defect in an capacitive element 408 associated with the isolated second electrode segment 425 will likewise be isolated from the functioning of the capacitor 400.

The capacitance C (in farads) of the capacitors 100, 400 can be estimated using the following formula:

$$C = \frac{A * \varepsilon_r * \epsilon_0}{d}$$

where:

$\in_r$=permittivity constant (8.854×10$^{-12}$F/m)

$\in_0$=dielectric constant of dielectric material

A=combined area of the electrode segments of the second electrode (m$^2$)

d=thickness of the dielectric layer (m)

The expected yield Y of the capacitors 100, 400 can be estimated using the Murphy yield model:

$$Y=[(1-e^{-A*D})/(A*D)]^2$$

where:

e≈2.7182818

A=combined area of the electrode segments of the second electrode

D=defect density of the capacitor (defects per unit area)

The Murphy yield model predicts that for increasing defect densities and increasing capacitor area, expected yield will drop. As an example, at a defect density of 0.4 defects per square centimeter and a combined area of 4 square centimeters, the Murphy yield would be approximately 25%.

As the power and frequency requirements of microprocessors increase, the capacitance requirements for decoupling and power dampening also increase. While increases in capacitance can be achieved through the use of dielectric materials having higher dielectric constants and smaller thicknesses, these improvements may not be sufficient to meet current capacitance requirements. Accordingly, increases in area will also be required. Because the probability of defects increases with increasing area, as predicted by the Murphy yield model, it becomes increasing difficult and expensive to produce capacitors having larger surface areas. It would thus be desirable to isolate the defects rather than discard the capacitor as defective. Such isolation can be effected using the various embodiments described herein.

To isolate the defective areas of the capacitor, one must first detect and locate the defect. Common fatal defects in capacitors generally fall in the category of leakage and shorting. They will result in a current flow where none is desired. Accordingly, they can be detected by applying a potential across the electrodes of the capacitor and observing the resulting current flow. If undesirable current flow is detected, the defects may be located using a variety of techniques, including measurement of electromagnetic flux and, depending upon magnitude of the current, measurement of temperature profiles. Locating the defects identifies which electrode segments contain one or more defective areas. Isolation of an electrode segment or segments containing defective areas will generally restore functionality to the capacitor.

Electrode segments containing one or more defective areas are termed defective electrode segments. Electrode segments having no detected defect are termed non-defective electrode segments, noting however that the term "non-defective" implies merely that no defect was detected and not an assurance of the absence of defects. It is noted that defective electrode segments need not be isolated from other defective electrode segments to effect restoration of functionality. It is further noted that where a non-defective electrode segment or block of non-defective electrode segments is bounded by only defective electrode segments, such non-defective electrode segments will be deemed defective electrode segments if isolation of each bounding defective electrode segment will result in isolation of such non-defective electrode segments.

An electrode segment is isolated from the interconnection bus when a potential applied to the interconnection bus and other electrode segments is not applied to the isolated electrode segment. Therefore, as each electrode segment is isolated from the interconnection bus, the available capacitance value of the capacitor is reduced. To reduce the impact of isolating an electrode segment, it is desirable to reduce the size of individual electrode segments, thus increasing the number of electrode segments per unit area. However, because increasing numbers of electrode segments per unit area also decreases the area of the second electrode, assuming constant spacing between adjacent electrode segments, the desire to reduce the size of the electrode segments must be balanced against the resulting loss of available surface area of the capacitor. Furthermore, increasing numbers of electrode segments per unit area also increases the complexity of the interconnection bus and reduces the size of the fusible links, thus making registration more critical.

For one embodiment, the surface area of each electrode segment is chosen such that the Murphy model predicts a yield of each electrode segment to be approximately 100%. For another embodiment, the surface area of each electrode segment is chosen such that the Murphy model predicts a yield for each electrode segment to be greater than approximately 95%. For yet another embodiment, the surface area of each electrode segment is chosen such that the Murphy model predicts a yield for each electrode segment to be greater than approximately 98%. As an example, for a defect density of 0.4 defects per square centimeter, the electrode segment chosen to have a surface area of approximately 0.04 square centimeters will result in an expected yield in excess of 98%. Electrode segments can be sized based on any expected yield specified by the user as long as there are at least two electrode segments per capacitor. Furthermore, electrode segments can be sized on an arbitrary basis, such as two per capacitor, three per capacitor, ten per capacitor, etc.

Electrode segments are not required to be equally sized or spaced apart. As an example, if process repeatability results in lower defect densities in one portion of the capacitor, the electrode segments in that portion could be larger than electrode segments in the remaining portion while maintaining constant expected yield per electrode segment.

The segmented capacitors of the various embodiments are suited for use in decoupling and power dampening applications. Use of the various embodiments in such applications is demonstrated in FIGS. 5A and 5B.

Figure 5B:
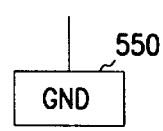
FIGS. 5A–5B are schematics of capacitors as used in decoupling and power dampening applications.
Figure 5A:
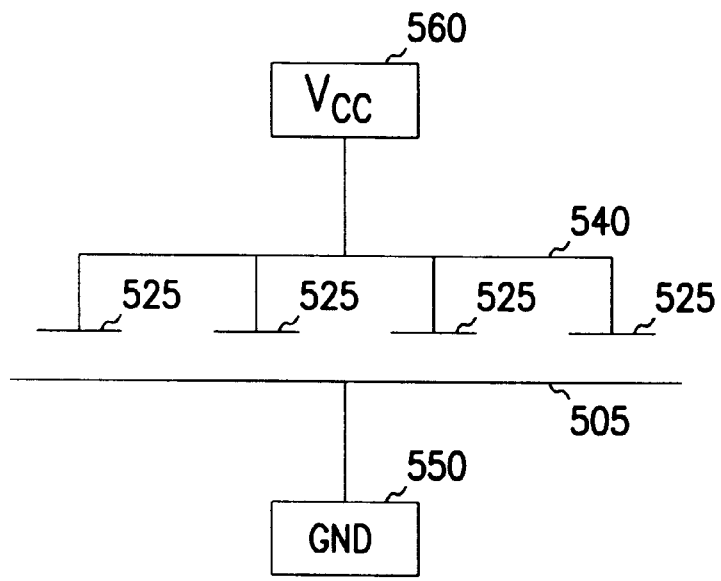
Figure 5B:
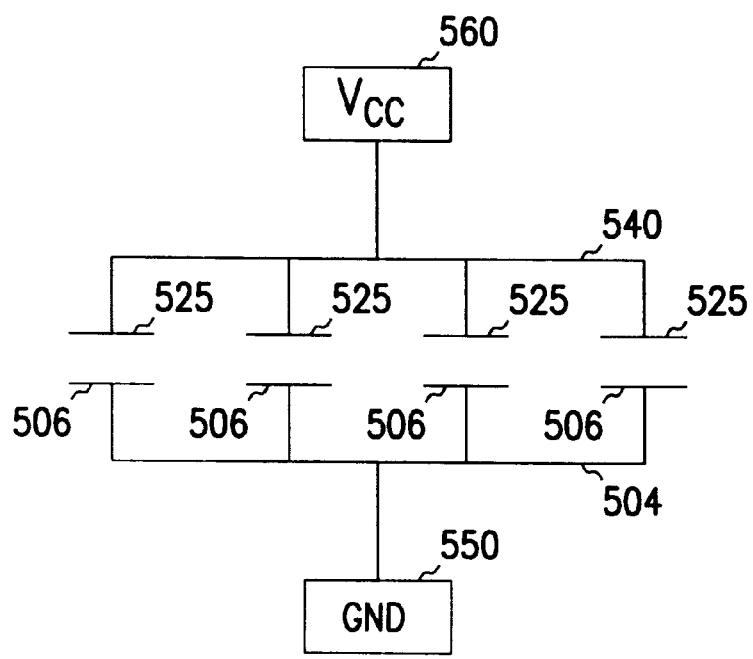

FIG. 5A is a schematic of one embodiment of a capacitor having a contiguous first electrode 505, a plurality of electrode segments 525 forming a second electrode, and an interconnection bus 540 coupling the plurality of electrode segments 525. A first potential source 550 is coupled to the first electrode 505. A second potential source 560 is coupled to the interconnection bus 540. For one embodiment, the first potential source 550 is a ground potential and the second potential source 560 is a supply potential, such as $V_{cc}$, as shown in FIG. 5A. For another embodiment, the first potential source 550 is a supply potential, such as $V_{cc}$, and the second potential source 560 is a ground potential. Other potentials and polarities are within the scope of the invention.

FIG. 5B is a schematic of one embodiment of a capacitor having a plurality of first electrode segments 506 forming a first electrode, a plurality of second electrode segments 525 forming a second electrode, a first interconnection bus 504 coupling the plurality of first electrode segments 506, and a second interconnection bus 540 coupling the plurality of second electrode segments 525. A first potential source 550 is coupled to the first interconnection bus 504. A second potential source 560 is coupled to the second interconnection bus 540. For one embodiment, the first potential source 550 is a ground potential and the second potential source 560 is a supply potential, such as $V_{cc}$, as shown in FIG. 5B. For another embodiment, the first potential source 550 is a supply potential, such as $V_{cc}$, and the second potential source 560 is a ground potential. Other potentials and polarities are within the scope of the invention.

The capacitors of the various embodiments include a first electrode, a second electrode containing electrode segments, and a dielectric layer interposed between the first electrode and second electrode. The capacitors further include an interconnection bus coupling the electrode segments of the second electrode. Additionally, the first electrode may contain electrode segments coupled by another interconnection bus. Conductive vias may be used to couple the electrode segments to the interconnection bus. Selective isolation of one or more electrode segments permits isolation and bypass of any defects identified in those electrode segments. Accordingly, a defect identified in one portion of the capacitor can be isolated and bypassed, thus restoring functionality to the capacitor. While such defect isolation will result in a capacitance value lower than the available value, such reduction may be justified to make usable an otherwise defective component.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. As an example, the capacitors of the various embodiments can be used to provide a trimmable capacitor, i.e., instead of isolating just defective electrode segments, non-defective electrode segments could be isolated to adjust the capacitance value of the capacitor. Accordingly, this application is intended to cover any adaptations or variations of the invention. It is manifestly intended that this invention be limited only by the following claims and equivalents thereof.

What is claimed is:

1. A capacitor, comprising:

a first electrode;

a dielectric layer overlying the first electrode;

a second electrode overlying the dielectric layer, wherein the second electrode comprises a plurality of electrode segments and wherein each of the electrode segments is physically separated from other electrode segments; and an interconnection bus coupling each of the plurality of electrode segments, wherein the interconnection bus contains at least one fusible link coupled to each of the plurality of electrode segments.

2. The capacitor of claim 1, wherein the first electrode comprises a copper layer formed on a printed circuit board.

3. The capacitor of claim 1, wherein the first electrode comprises a conductive material selected from the group consisting of a plated metal, a laminated metal foil, plated copper and laminated copper foil.

4. The capacitor of claim 1, wherein the electrode segments are substantially rectangular and arranged in a regular grid pattern of repeating rows and columns.

5. The capacitor of claim 1, wherein each of the plurality of electrode segments is coupled to four fusible links.

6. The capacitor of claim 1, wherein each of the plurality of electrode segments is coupled to one fusible link.

7. The capacitor of claim 1, wherein each of the plurality of electrode segments are substantially planar.

8. A capacitor, comprising:

a plurality of capacitive elements, each capacitive element comprising:

a first electrode segment;

a dielectric layer overlying the first electrode segment; and a second electrode segment overlying the dielectric layer;

a first interconnection bus coupling the first electrode segment of each of the plurality of capacitive elements; and a second interconnection bus, wherein the second electrode segment of each of the plurality of capacitive elements is coupled to the second interconnection bus through at least one fusible link.

9. The capacitor of claim 8, wherein the first electrode segment of each of the plurality of capacitive elements is substantially planar.

10. The capacitor of claim 8, wherein the first interconnection bus couples the first electrode segment of each of the plurality of capacitive elements in parallel.

11. A capacitor, comprising:

a first electrode;

a second electrode having a first portion, a second portion and a third portion, wherein the first portion, the second portion and the third portion are each physically separated from each other;

a dielectric layer interposed between the first electrode and the second electrode; and an interconnection bus coupled to the first portion, the second portion and the third portion of the second electrode;

wherein the interconnection bus comprises at least one fusible link coupled to the first portion of the second electrode; and wherein the first portion of the second electrode can be electrically isolated from the second portion and the third portion of the second electrode by opening the at least one fusible link coupled to the first portion of the second electrode without electrically isolating the second portion of the second electrode from the third portion of the second electrode.

* * * * *

UNITED STATES PATENT AND TRADEMARK OFFICE
CERTIFICATE OF CORRECTION

PATENT NO. : 6,452,776 B1
DATED : September 17, 2002
INVENTOR(S) : Kishore K. Chakravorty It is certified that error appears in the above-identified patent and that said Letters Patent is hereby corrected as shown below:

Drawings,
Sheet 4, below "FIG. 4B", delete "FIG. 5B" including the partial drawing above "FIG. 5B"

Column 2,
Line 24, delete "FIGS. 1A-1B" and insert -- FIGS. 1A-1E --, therefor.

Column 10,
Line 45, insert the following:

--12. An electronic device, comprising:
a first potential source;
a second potential source; and
at least one capacitor comprising:
    a first electrode coupled to the first potential source;
    a dielectric layer overlying the first electrode;
    a second electrode overlying the dielectric layer,
wherein the second electrode comprises a plurality of electrode segments and
wherein each of the electrode segments is physically separated from other electrode segments; and
interconnection bus coupled to the second potential source and having a plurality of fusible links,
wherein each of the plurality of electrode segments is coupled to at least one of the plurality of fusible links.--

Signed and Sealed this

Twenty-first Day of June, 2005

JON W. DUDAS
*Director of the United States Patent and Trademark Office*